United States Patent
Washio et al.

(10) Patent No.: US 7,598,014 B2
(45) Date of Patent: Oct. 6, 2009

(54) THICK FILM PHOTORESIST COMPOSITION AND METHOD OF FORMING RESIST PATTERN

(75) Inventors: Yasushi Washio, Kawasaki (JP); Koji Saito, Kawasaki (JP)

(73) Assignee: Tokyo Ohka Kogyo Co., Ltd., Kawasaki-shi (JP)

(*) Notice: Subject to any disclaimer, the term of this patent is extended or adjusted under 35 U.S.C. 154(b) by 135 days.

(21) Appl. No.: 10/578,398

(22) PCT Filed: Nov. 18, 2004

(86) PCT No.: PCT/JP2004/017534

§ 371 (c)(1),
(2), (4) Date: May 4, 2006

(87) PCT Pub. No.: WO2005/054951

PCT Pub. Date: Jun. 16, 2005

(65) Prior Publication Data

US 2007/0105037 A1    May 10, 2007

(30) Foreign Application Priority Data

Dec. 1, 2003  (JP)  ............. 2003-401563
Sep. 13, 2004  (JP)  ............. 2004-265693

(51) Int. Cl.
*G03F 7/00* (2006.01)
*G03F 7/004* (2006.01)

(52) U.S. Cl. .............. 430/270.1; 430/281.1; 430/286.1; 430/287.1; 430/905; 430/913

(58) Field of Classification Search .............. 430/270.1, 430/281.1, 286.1, 287.1, 311, 302, 905, 913
See application file for complete search history.

(56) References Cited

U.S. PATENT DOCUMENTS

| | | | |
|---|---|---|---|
| 5,068,263 A | 11/1991 | Noguchi | |
| 5,965,328 A | 10/1999 | Sano et al. | |
| 6,306,555 B1 * | 10/2001 | Schulz et al. | ............ 430/270.1 |
| 6,485,885 B1 * | 11/2002 | Oka et al. | ................ 430/270.1 |
| 6,702,437 B2 * | 3/2004 | Fujimaki et al. | ............ 347/101 |
| 7,247,659 B2 * | 7/2007 | Kura et al. | .................... 522/12 |
| 2003/0059706 A1 | 3/2003 | Misumi et al. | |

FOREIGN PATENT DOCUMENTS

| | | |
|---|---|---|
| EP | 762208 A2 * | 3/1997 |
| JP | H02-097516 | 4/1990 |
| JP | H08-029979 | 2/1996 |
| JP | 08-078318 | 3/1996 |
| JP | 2000-039709 | 2/2000 |

OTHER PUBLICATIONS

Office Action issued on counterpart Japanese Patent Application No. 2004-265693, dated May 7, 2009.

* cited by examiner

*Primary Examiner*—Amanda C. Walke
(74) *Attorney, Agent, or Firm*—Knobbe, Martens, Olson & Bear, LLP

(57) ABSTRACT

A negative thick film photoresist composition with improved alkali developability is provided. The composition comprises: (A) a resin component containing (a) from 61 to 90% by weight of a structural unit derived from a cyclic alkyl (meth)acrylate ester, and (b) a structural unit derived from a radical polymerizable compound containing a hydroxyl group, (B) a polymerizable compound containing at least one ethylenic unsaturated double bond, (C) a photopolymerization initiator, and (D) an organic solvent.

5 Claims, No Drawings

THICK FILM PHOTORESIST COMPOSITION AND METHOD OF FORMING RESIST PATTERN

CROSS-REFERENCE TO RELATED APPLICATIONS

This application is the U.S. National Phase filing under 35 U.S.C. §371 of PCT/JP2004/017534, filed Nov. 18, 2004, which designated the United States and was published in a language other than English, which claims priority under 35 U.S.C. §119(a)-(d) to Japanese Patent Application Nos. 2003401563, filed Dec. 1, 2003 and 2004265693, filed Sep. 13, 2004. The content of these applications is incorporated herein by reference in their entireties.

TECHNICAL FIELD

The present invention relates to a thick film photoresist composition and a method of forming a resist pattern.

BACKGROUND ART

Photofabrication, which is now the most widely used technique for precision microprocessing, is a generic term describing the technology used for producing precision components such as semiconductor packages by applying a photosensitive resin composition to the surface of the processing target to form a coating, patterning this coating using photolithography techniques, and then conducting either chemical etching or electrolytic etching using the patterned coating as a mask, and/or electroforming via electroplating.

Recently, reductions in the size of electronic equipment have lead to further developments in higher density packaging of semiconductor packages, including multipin thin film packaging, reductions in package size, and other improvements in packaging density based on two dimensional packaging techniques or three dimensional packaging techniques using flip-chip systems. In these types of high density packaging techniques, connection terminals, including protruding electrodes (mounting terminals) known as bumps which protrude above the package, or metal posts that extend from peripheral terminals on the wafer and connect rewiring with the mounting terminals, must be positioned on the surface of the substrate with very high precision.

The materials used in the above type of photofabrication are typically thick film photoresist compositions. Thick film photoresist compositions are used for forming thick resist layers, and can be used, for example, in the formation of bumps or metal posts by a plating process.

Bumps or metal posts can be formed, for example, by forming a thick resist layer with a film thickness of approximately 20 μm on top of a substrate, exposing the resist layer through a predetermined mask pattern, developing the layer to form a resist pattern in which the portions for forming the bumps or metal posts have been selectively removed (stripped), embedding a conductor such as copper into the stripped portions (the resist-free portions) using plating, and then removing the surrounding residual resist pattern.

Positive photosensitive resin compositions comprising a compound containing a quinone diazide group have been disclosed as suitable thick film photoresists for the formation of bumps or wiring (for example, see patent reference 1).

Furthermore, negative photoresist compositions that can also be used for forming thick films have been disclosed in the patent reference 2 listed below.

(Patent Reference 1)
Japanese Unexamined Patent Application, First Publication No. 2002-258479
(Patent Reference 2)
Japanese Unexamined Patent Application, First Publication No. Hei 8-78318

However, conventional negative thick film photoresist compositions suffer from unsatisfactory alkali developability. In this description, unsatisfactory alkali developability describes the situation where the contrast between the exposed portions and the unexposed portions following alkali developing is unsatisfactory. Deterioration in the alkali developability can cause deterioration in both the resolution and the adhesion of the residual resist pattern following developing, and is consequently undesirable.

Even if a favorable level of alkali developability can be achieved with a resist composition that is typically used for forming thin films for normal semiconductor applications, there is no way of predicting whether a similar favorable result can be achieved if a thick film resist layer is formed using the same composition.

DISCLOSURE OF INVENTION

The present invention takes the above factors into consideration, with an object of improving the alkali developability for a negative thick film photoresist composition.

In order to achieve the above object, the present invention employs the aspects described below.

A first aspect provides a thick film photoresist composition comprising:

(A) a resin component containing (a) from 61 to 90% by weight of a structural unit derived from a cyclic alkyl (meth)acrylate ester, and (b) a structural unit derived from a radical polymerizable compound containing a hydroxyl group, (B) a polymerizable compound containing at least one ethylenic unsaturated double bond, (C) a photopolymerization initiator, and (D) an organic solvent.

A second aspect provides a method of forming a resist pattern, wherein the resist pattern is formed using a thick film photoresist composition according to the present invention.

In this description and the appended claims, the term "structural unit" refers to a monomer unit within a polymer (resin).

Furthermore, the term "(meth)acrylic acid" is a generic terms that includes both methacrylic acid and acrylic acid. Similarly, the term "(meth)acrylate" is a generic term terms that includes both methacrylate and acrylate.

EFFECTS OF THE INVENTION

The present invention enables an improvement in the alkali developability of negative thick film photoresist compositions.

BEST MODE FOR CARRYING OUT THE INVENTION

Thick Film Photoresist Composition

Component (A)

—(a) Structural Unit Derived from a Cyclic Alkyl(meth)acrylate Ester

By incorporating from 61 to 90% by weight (and preferably from 65 to 75% by weight) of the structural unit (a) within the component (A), the alkali developability of the thick film photoresist composition of the present invention can be improved. As a result, the resolution and adhesion of the composition can be improved, and the level of developing residues can be reduced. In addition, the co-solubility with the component (B) and the organic solvent (D) described below can also be improved. Furthermore, high sensitivity can be achieved even when a thick film resist pattern is formed. By ensuring a proportion of at least 61% by weight, satisfactory manifestation of the above effects can be achieved, whereas ensuring a proportion of no more than 90% by weight enables a more favorable balance to be achieved with the other structural units such as the aforementioned structural unit (b), and enables the suppression of pattern cracking, which is caused by the resist pattern becoming overly hard and then cracking, either due to impacts sustained during the plating or the like conducted following resist pattern formation, or due to thermal shock.

Suitable examples of the cyclic alkyl (meth)acrylate ester that gives rise to the structural unit (a) include cyclohexyl (meth)acrylate, 2-methylcyclohexyl(meth)acrylate, dicyclopentanyloxyethyl(meth)acrylate, isobornyl(meth)acrylate, and dicyclopentanyl (meth)acrylate. Of these, dicyclopentanyl(meth)acrylate is preferred.

—(b) Structural Unit Derived from a Radical Polymerizable Compound Containing a Hydroxyl Group Suitable examples of the radical polymerizable compound containing a hydroxyl group that gives rise to the structural unit (b) include 2-hydroxyethyl acrylate, 2-hydroxypropyl acrylate, 2-hydroxybutyl acrylate, 4-hydroxybutyl acrylate, 2-hydroxy-3-phenoxypropyl acrylate, 2-acryloyloxyethyl-2-hydroxyethylphthalic acid, 2-hydroxyethyl methacrylate, 2-hydroxypropyl methacrylate, 2-hydroxybutyl methacrylate, 4-hydroxybutyl methacrylate, 2-hydroxy-3-phenoxypropyl methacrylate, and 2-methacryloyloxyethyl-2-hydroxyethylphthalate. Of these, 2-hydroxyethyl methacrylate is preferred.

The structural unit (b) typically accounts for at least 1% by weight, but less than 10% by weight, and preferably from 3 to 9% by weight, of the component (A).

By ensuring a proportion of at least 1% by weight, the solubility can be controlled at a suitable level, whereas by ensuring a proportion of less than 10% by weight, film thinning following alkali developing of the resist pattern can be prevented. Preventing such film thinning enables the resolution to be improved.

—(d) Structural Unit Derived from an Unsaturated Carboxylic Acid

The component (A) preferably also contains a structural unit (d) derived from an unsaturated carboxylic acid.

Suitable examples of the unsaturated carboxylic acid that gives rise to the structural unit (d) include monocarboxylic acids such as acrylic acid, methacrylic acid, and crotonic acid; dicarboxylic acids such as maleic acid, fumaric acid, citraconic acid, mesaconic acid, and itaconic acid; compounds in which a dicarboxylic acid is condensed with (meth) acrylic acid or the like via a diol, such as mono(2-(meth) acryloyloxy)ethyl succinate, mono(2-(meth)acryloyloxy) ethyl maleate, mono(2-(meth)acryloyloxy)ethyl phthalate, and mono(2-(meth)acryloyloxy)ethyl hexahydrophthalate; as well as monoesters and the like of unsaturated dicarboxylic acids.

This unsaturated carboxylic acid is preferably acrylic acid or methacrylic acid, and methacrylic acid is particularly preferred.

The proportion of the structural unit (d) within the component (A) is preferably within a range from 1 to 40% by weight.

By ensuring a proportion of at least 1% by weight, problems such as resolution deterioration and film thinning can be suppressed.

—Structural Units Derived from Other Radical Polymerizable Compounds

In addition to the essential structural units (a) and (b), and the optional structural unit (d), the component (A) may also comprise other structural units derived from radical polymerizable compounds (hereafter referred to as "other structural units") that are capable of copolymerization with the above structural units. The proportion of these other structural units within the component (A) is typically within a range from 1 to 37% by weight, and preferably from 1 to 20% by weight.

As this other structural unit, using a structural unit (c) derived from a radical polymerizable compound represented by a general formula (1) shown below is particularly preferred in terms of improving the alkali developability and improving the removability (during the formation of bumps or the like, following the formation of the resist pattern and subsequent plating, the ease with which the resist pattern is able to be removed).

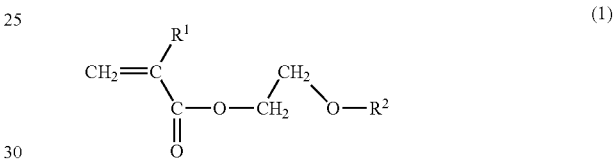

(1)

(wherein, $R^1$ represents a hydrogen atom or a methyl group, and $R^2$ represents a hydrogen atom or an alkyl group of 1 to 4 carbon atoms)

The group $R^1$ may be either a hydrogen atom or a methyl group, although a hydrogen atom is preferred.

The group $R^2$ is either a hydrogen atom or an alkyl group of 1 to 4 carbon atoms (both straight chain and branched groups are suitable), and suitable examples include a methyl group, ethyl group, propyl group, isopropyl group, n-butyl group, isobutyl group, or tert-butyl group, although a methyl group or an ethyl group is preferred, and an ethyl group is particularly desirable.

As the other structural unit, structural units other than the aforementioned structural unit (c), including those described below, can also be used. Examples of suitable other structural units besides the structural unit (c) include alkyl (meth)acrylate esters such as methyl methacrylate, ethyl methacrylate, n-butyl (meth)acrylate, sec-butyl (meth)acrylate, t-butyl (meth)acrylate, and isopropyl(meth)acrylate; aryl(meth) acrylate esters such as phenyl(meth)acrylate and benzyl (meth)acrylate; diesters of dicarboxylic acids such as diethyl maleate, diethyl fumarate, and diethyl itaconate; as well as styrene, α-methylstyrene, m-methylstyrene, p-methylstyrene, vinyltoluene, p-methoxystyrene, acrylonitrile, methacrylonitrile, vinyl chloride, vinylidene chloride, acrylamide, methacrylamide, and vinyl acetate.

Of these, n-butyl (meth)acrylate is preferred in terms of adjusting the glass transition temperature of the component (A).

The weight average molecular weight (the polystyrene equivalent weight average molecular weight determined by gel permeation chromatography) of the component (A) is typically within a range from 10,000 to 50,000, and preferably from 15,000 to 30,000.

Furthermore, the component (A) can comprise either a single resin, or a mixture of two or more different resins.

The component (A) is preferably a copolymer comprising the essential structural units described above, and other optional structural units as required.

The component (A) can be produced by subjecting the monomers that give rise to each of the structural units to radical polymerization using a typical polymerization method.

Component (B)

There are no particular restrictions on the component (B), provided it undergoes either thermal polymerization or photopolymerization, and suitable examples include the compounds described below.

Polymerizable Compounds Containing one Ethylenic Unsaturated Double Bond:

The radical polymerizable compounds (monomers) used in the synthesis of the component (A) can be used, although monoesters of methacrylic acid and acrylic acid represented by the formula below are preferred.

$$CH_2=CHCO-(OC_2H_4)_n-O\text{-para-}C_6H_4-R^{11}$$

(wherein, n=0 to 8, and $R^{11}$ represents either H or an alkyl group of C1 to C9)

Specific examples include the commercially available products ARONIX M-101 (n≅2, $R^{11}$=H) (hereafter, all commercial products are listed by their product names), ARONIX M-102 (n≅4, $R^{11}$=H), ARONIX M-111 (n≅1, $R^{11}$=n-$C_9H_{19}$), ARONIX M-113 (n≅4, $R^{11}$=n-$C_9H_{19}$), ARONIX M-114 (n≅8, $R^{11}$=n-$C_9H_{19}$), ARONIX M-117 (n≅2.5, $R^{11}$=n-$C_9H_{19}$) (all manufactured by Toagosei Co., Ltd.), and KAYARAD R-564 (n≅2.3, $R^{11}$=H) (manufactured by Nippon Kayaku Co., Ltd.).

Other related compounds include the commercially available products KAYARAD TC-110S and TC-120S (manufactured by Nippon Kayaku Co., Ltd.), and the products V-158 and V-2311 (manufactured by Osaka Organic Chemical Industry Ltd.).

Polymerizable Compounds Containing Two Ethylenic Unsaturated Double Bonds:

Bifunctional (meth)acrylates, namely (meth)acrylate diesters of bivalent alcohols can be used. Examples of preferred bifunctional (meth)acrylates include the compounds represented by the formula shown below.

$$CH_2=CHCO-(OC_2H_4)_n-O\text{-para-}C_6H_4-C(R^{12})_2\text{-para-}C_6H_4-O-(C_2H_4O)_m-COCH=CH_2$$

(wherein, n=0 to 8, m=0 to 8, and $R^{12}$ represents either H or $CH_3$)

Specific examples include the commercially available products ARONIX M-210 (n≅2, m≅2, $R^{12}$=$CH_3$) (manufactured by Toagosei Co., Ltd.), KAYARAD R-551 (n+m≅4, $R^{12}$=$CH_3$), and KAYARAD R-712 (n+m≅4, $R^{12}$=H) (both manufactured by Nippon Kayaku Co., Ltd.).

Furthermore, compounds represented by the following formula can also be used favorably.

$$CH_2=CHCOO-R^3-COCH=CH_2$$

(wherein, $R^3$ represents from 1 to 10 repetitions of an oxyalkyl group of 2 to 8 carbon atoms, an ethylene glycol group or a propylene glycol group)

Specific examples include the commercially available products ARONIX M-240 ($R^3$=—$(CH_2CH_2O)_n$—, n≅4), ARONIX M-245 ($R^3$=—$(CH_2CH_2O)_n$—, n≅9) (both manufactured by Toagosei Co., Ltd.), and KAYARAD HDDA ($R^3$=—$(CH_2CH_2CH_2CH_2CH_2O)$—), KAYARAD NPGDA ($R^3$=—$(CH_2C(CH_3)_2CH_2O)$—), KAYARAD TPGDA ($R^3$=—$(CH_2CH(CH_3)O)$—), KAYARAD PEG400DA ($R^3$=—$(CH_2CH_2O)_n$—, n≅8), KAYARAD MANDA ($R^3$=—$(CH_2C(CH_3)_2CH_2O)$—), KAYARAD HX-220 ($R^3$=—$(CH_2CH_2CH_2CH_2CH_2O)_m$—$CH_2$—$C(CH_3)_2$ $COOCH_2C(CH_3)_2CH_2O(COCH_2CH_2CH_2CH_2CH_2O)_n$—, m+n=2) and KAYARAD HX-620 ($R^3$=—$(CH_2CH_2CH_2CH_2CH_2O)_m$—$CH_2$—$C(CH_3)_2COOCH_2C$ $(CH_3)_2CH_2O(COCH_2CH_2CH_2CH_2O)_n$—, m+n=4) (all manufacture by Nippon Kayaku Co., Ltd.).

In addition, compounds represented by the following formula can also be used favorably.

$$A-(M-N)_n-M-A$$

(wherein, A is a (meth)acrylic acid residue ($CH_2$=C(H or $CH_3$)COO—), M is a bivalent alcohol residue, N is a dibasic acid residue, and n=0 to 15)

Specific examples include oligoester acrylates (including the commercially available products ARONIX M-6100, M-6200, ARONIX M-6250, ARONIX M-6300, ARONIX M-6400 and ARONIX M-6500 (all manufactured by Toagosei Co. Ltd.), as well as KAYARAD R-604 (manufactured by Nippon Kayaku Co., Ltd.), and V260, V312 and V335HP (all manufactured by Osaka Organic Chemical Industry Ltd.)). Polymerizable compounds containing three or more ethylenic unsaturated double bonds:

(Meth)acrylate esters of trivalent or higher valency alcohols can be used. Examples of preferred structures include the compounds represented by the formula shown below.

$$[CH_2=CHCO-(OC_3H_6)_n-OCH_2]_3-CCH_2R^4$$

(wherein, n=0 to 8, and $R^4$ is a group selected from H, OH, and $CH_3$)

Specific examples include the commercially available products ARONIX M-309 (n=0, $R^4$=$CH_3$) and ARONIX M-310 (n≅1, $R^4$=$CH_3$) (both manufactured by Toagosei Co., Ltd.), KAYARAD TMPTA (n=0, $R^4$=$CH_3$) (manufactured by Nippon Kayaku Co., Ltd.), and V-295 (n=0, $R^4$=$CH_3$) and V-300 (n=0, $R^4$=OH) (both manufactured by Osaka Organic Chemical Industry Ltd.).

Furthermore, compounds represented by the following formula can also be used favorably.

$$[(CH_2=CHCOOCH_2)_3-CCH_2]_2-R^5$$

(wherein, $R^5$=O or $CH_2$)

Specific examples include the commercially available product ARONIX M-400 (manufactured by Toagosei Co., Ltd. Similarly, compounds represented by the following formula can also be used favorably.

$$A-(X(A)-Y)_n-XA_2$$

(wherein, A is a (meth)acrylic acid, X is a polyvalent alcohol, Y is a polybasic acid, and n=0 to 15)

Specific examples include the commercially available products ARONIX M-7100, M-8030, M-8060, M-8100 and M-9050 (all manufactured by Toagosei Co. Ltd.).

Furthermore, compounds represented by the following formula can also be used favorably.

$$[(CH_2=CHCO-(OC_5H_{10}CO)_m-]_a[-(OCH_2)_3 CCH_2OCH_2C(CH_2O)_3-](COCH=CH_2)_b$$

(wherein, m≅1 or 2, a≅an integer of 2 to 6, and b≅an integer of 0 to 6)

Specific examples include the commercially available products KAYARAD DPCA-20 (m≅1, a≅2, and b≅4), KAYARAD DPCA-30 (m≅1, a≅3, and b≅3), KAYARAD DPCA-60 (m≅1, a≅6, and b≅0), and KAYARAD DPCA-120 (m≅2, a≅6, and b≅0) (all manufactured by Nippon Kayaku Co., Ltd.), as well as V-360, -GPT, -3PA, and -400 (all manufactured by Osaka Organic Chemical Industry Ltd.).

In addition, compounds represented by the following formula can also be used favorably.

[CH$_2$=CHCO—(OC$_2$H$_4$)$_n$—OCH$_2$]$_3$—CCH$_2$R$^6$ (wherein, the value of n may vary, although the total sum of n is from 0 to 24, and R$^6$ is a group selected from H, OH, and CH$_3$)

Specific examples include the commercially available products ARONIX M-350 (sum of n=3, R$^6$=CH$_3$) and ARONIX M-360 (sum of n=6, R$^6$=CH$_3$) (both manufactured by Toagosei Co., Ltd.), and SR-502 (sum of n=9, R$^6$=CH$_3$), SR-9035 (sum of n=15, R$^6$=CH$_3$) and SR-415 (sum of n=20, R$^6$=CH$_3$) (all manufactured by Sartomer Company Inc.).

The component (B) can use either a single compound, or a mixture of two or more different compounds.

In terms of achieving the most favorable effect, the quantity of the component (B) is preferably within a range from 30 to 200 parts by weight, and even more preferably from 50 to 150 parts by weight, per 100 parts by weight of the component (A).

(C) Photopolymerization Initiator

By incorporating the component (C), exposure can be used to cause the component (C) to act upon the component (A), making the exposed portions of the component (A) become alkali insoluble. This causes a difference in solubility to develop between the exposed portions and the unexposed portions, and by then conducting alkali developing, the unexposed portions are dissolved in the alkali developing solution, thus yielding a resist pattern.

As the component (C), either a radical photopolymerization initiator that is capable of reacting with the ethylenic compound, or in those cases where the composition of the present invention contains epoxy groups, a cationic photopolymerization initiator that is capable of reacting with epoxy groups, can be used.

Examples of suitable radical photopolymerization initiators include α-diketones such as benzil and diacetyl; acyloins such as benzoin; acyloin ethers such as benzoin methyl ether, benzoin ethyl ether, and benzoin isopropyl ether; benzophenones such as thioxanthone, 2,4-diethylthioxanthone, thioxanthone-4-sulfonic acid, benzophenone, 4,4'-bis(dimethylamino)benzophenone, and 4,4'-bis(diethylamino)benzophenone; acetophenones such as acetophenone, p-dimethylaminoacetophenone, α,α'-dimethoxyacetoxybenzophenone, 2,2'-dimethoxy-2-phenylacetophenone, p-methoxyacetophenone, 2-methyl-[4-(methylthio)phenyl]-2-morpholino-1-propanone, and 2-benzyl-2-dimethylamino-1-(4-morpholinophenyl)-butan-1-one; quinones such as anthraquinone and 1,4-naphthoquinone; halogen compounds such as phenacyl chloride, tribromomethylphenylsulfone, and tris(trichloromethyl)-s-triazine; peroxides such as di-t-butyl peroxide, acylphosphine oxides such as 2,4,6-trimethylbenzoyldiphenylphosphine oxide; and imidazoles such as dimers of 2-(o-chlorophenyl)-4,5-diphenylimidazole.

Furthermore, examples of suitable commercially available products include IRGACURE 184, 651, 500, 907, CGI369, and CG24-61 (manufactured by Ciba Geigy Corporation), LUCIRIN LR8728 and TPO (manufactured by BASF Corporation), DAROCURE 1116 and 1173 (manufactured by Merck KGaA), and UVECRYL p36 (manufactured by UCB Chemicals Corporation).

Furthermore, examples of suitable cationic photopolymerization initiators include the commercially available products listed below.

Diazonium salts such as ADEKA ULTRASET PP-33 (manufactured by Asahi Denka Kogyo Co., Ltd.), sulfonium salts such as OPTOMER SP-150 and 170 (manufactured by Asahi Denka Kogyo Co., Ltd.), and metallocene compounds such as IRGACURE 261 (manufactured by Ciba Geigy Corporation).

Amongst the various photopolymerization initiators listed above, preferred compounds include radical photopolymerization initiators, including acetophenones such as 2-methyl-[4-(methylthio)phenyl]-2-morpholino-1-propanone and 2-benzyl-2-dimethylamino-1-(4-morpholinophenyl)-butan-1-one, and halogen compounds such as phenacyl chloride, tribromomethylphenylsulfone, 2,4,6-trimethylbenzoyl-diphenylphosphine oxide, and tris(trichloromethyl)-s-triazine, as well as all of the above cationic photopolymerization initiators.

The component (C) can use either a single compound, or a mixture of two or more different compounds.

The quantity used of the component (C) is preferably within a range from 1 to 50 parts by weight, and even more preferably from 5 to 30 parts by weight, per 100 parts by weight of the component (A).

Other Optional Components

Other additives may also be appropriately selected and blended into a resist composition of the present invention.

Examples of such other additives include surfactants, adhesion assistants, organic acids or acid anhydrides, fillers, colorants, and viscosity regulators.

In addition, a small quantity of a conventional polymerization inhibitor is also added to the resin component. Accordingly, the resist composition also comprises a very small quantity of polymerization inhibitor.

(D) Organic Solvent

A resist composition of the present invention is preferably used as a solution produced by dissolving the component (A), the component (B), the component (C), and any other optional components in the component (D).

As the component (D), a solvent that is capable of dissolving all of the components to generate a homogeneous solution, but reacts with none of the components, is used.

Specific examples of suitable solvents for the component (D) include ketones such as acetone, methyl ethyl ketone, cyclohexanone, methyl isoamyl ketone, 2-heptanone, acetophenone, methyl isobutyl ketone (MIBK) and methyl ethyl ketone (MEK); polyhydric alcohols and derivatives thereof such as ethylene glycol, ethylene glycol monoacetate, diethylene glycol, diethylene glycol monoacetate, propylene glycol, propylene glycol monoacetate, and the monomethyl ether, monoethyl ether, monopropyl ether, monobutyl ether or monophenyl ether of dipropylene glycol or dipropylene glycol monoacetate; cyclic ethers such as dioxane; and esters such as methyl lactate, ethyl lactate, methyl acetate, isobutyl acetate, ethyl acetate, butyl acetate, methyl pyruvate, ethyl pyruvate, methyl methoxypropionate, and ethyl ethoxypropionate.

Of these, a component (D) comprising one or more of methyl isobutyl ketone and methyl ethyl ketone (and most preferably methyl isobutyl ketone) is preferred. The quantity of these preferred solvents within the component (D) is preferably at least 50% by weight.

The reason for this requirement is that by using such a quantity, when the resist composition is applied using a method which involves dripping the composition onto a substrate followed by spinning, the bead length (the length of the built-up portion at the leading edge of the resist) is short, enabling good suppression of such edge build-up. Edge build-up reduces the surface area available for element processing and is consequently undesirable. Furthermore, edge build-up becomes particularly marked upon baking. Furthermore, this edge build-up phenomenon is particularly problematic in thick film resist layers.

This suppression of edge build-up is thought to be due to the improved drying characteristics of the composition.

In addition, foaming (the generation of bubbles at the surface of the resist layer) is also suppressed.

Furthermore, the uniformity of application is also very favorable.

In the component (D), the quantity of the methyl isobutyl ketone and/or methyl ethyl ketone may account for 100% by weight of the solvent, although if a mixture with other solvents is used, then the remaining solvent or solvents can be one or more of the other solvents listed above. The use of the monomethyl ether or the like of dipropylene glycol or dipropylene glycol monoacetate is also preferred, as such solvents can be used as the solvent medium for the polymerization of the resin, and as the solvent for the resist composition, thereby simplifying and improving the economy of the process. Propylene glycol monomethyl ether acetate (PGMEA) is particularly desirable.

The quantity used of the component (D) is typically at least 30 parts by weight, and preferably at least 40 parts by weight, per 100 parts by weight of the component (A).

If a spin coating method is used, then in order to form a thick film with a film thickness of 10 μm or greater, the quantity of the component (D) is preferably sufficient to produce a solid fraction concentration for the resist composition that falls within a range from 30 to 65% by weight.

A resist composition of the present invention is suitable for forming a thick film resist layer with a thickness of 10 to 150 μM, and preferably from 20 to 120 μm, and even more preferably from 20 to 80 μm, on top of a substrate.

Potential applications for resist compositions of the present invention include the formation of connection terminals such as bumps and metal posts or the formation of wiring patterns or the like, either during the production of circuit boards, or during the production of electronic components such as CSP (chip size packages) for mounting on circuit boards.

[Method of Forming a Resist Pattern]

In the formation of a resist pattern, first, a resist layer is formed on a substrate using a resist composition.

There are no particular restrictions on the substrate, and conventional substrates can be used, including substrates for electronic components as well as substrates on which a predetermined wiring pattern has already been formed. Specific examples of suitable substrates include metal-based substrates such as silicon, silicon nitride, titanium, tantalum, palladium, titanium-tungsten, copper, chrome, iron and aluminum, as well as glass substrates. Suitable materials for the wiring pattern include copper, solder, chrome, aluminum, nickel, and gold.

Specifically, the resist composition is applied to a predetermined substrate, and heating is used to remove the solvent, thus forming the desired resist layer. There are no particular restrictions on the method used to apply the composition to the substrate, and conventional methods such as spin coating can be used.

The heating conditions vary depending on factors such as the nature of each of the components within the composition, the blend proportions used, and the thickness with which the composition is applied, although typical conditions involve heating at 70 to 120° C. for 5 to 20 minutes, although a temperature from 80 to 100° C. is preferred. If the heating time is too short, then the adhesion during developing tends to be poor, whereas if the heating time is too long, then heat fogging can cause a deterioration in resolution.

The film thickness of the resist layer is typically within a range from 10 to 150 μm, and preferably from 20 to 120 μm, and even more preferably from 20 to 80 μm.

Subsequently, ultraviolet light or visible light within a range from 200 to 500 μm is irradiated onto the resist layer through a mask with a predetermined pattern, thus photocuring the necessary portions of the layer.

As the light source for the activated light beam, a low pressure mercury lamp, high pressure mercury lamp, ultra high pressure mercury lamp, metal halide lamp or argon gas laser or the like can be used.

Furthermore, activated energy beams such as X-rays and electron beams can also be used for curing the composition. The exposure dose varies depending on the nature of each of the components within the composition, the blend proportions used, and the dried film thickness, although in those cases where a high pressure mercury lamp is used, a typical exposure dose is within a range from 100 to 500 mJ/cm$^2$ (measured using a UV42 device manufactured by Orc Co., Ltd.).

Subsequently, using an aqueous alkali solution as the developing solution, the unnecessary portions of the resist layer are dissolved and removed, leaving only the exposed portions formed as a pattern.

As the developing solution, an aqueous solution of tetramethylammonium hydroxide (TMAH) or the like is used.

In the case of the formation of connection terminals such as bumps, plating can be conducted in the manner described below. Namely, the connection terminals such as the metal posts or bumps can be formed by embedding a conductor such as a metal within the resist-free portions (the portions removed by the developing solution) of the produced resist pattern, using a plating method.

There are no particular restrictions on the method used for the plating process, and any of the known, conventional methods can be employed. As the plating liquid, solder plating, copper plating, gold plating, or nickel plating solutions can be favorably employed.

Finally, the remaining resist pattern is removed by conventional methods, using a stripping solution or the like.

EXAMPLES

As follows is a more detailed description of the present invention based on a series of examples. Unless otherwise stated, the units "parts" and "%" refer to "parts by weight" and "% by weight" respectively.

Of the resist compositions described below, samples A, D, E, F, G, and H represent examples of the present invention. Samples B and C are comparative examples.

(Production of Resist Compositions)

100 parts by weight of each of a series of resin components produced by radical polymerization of the monomers shown below in Table 1 was mixed with a series of other components in accordance with the compositions described below, thus yielding a series of resist compositions.

Resist Composition Photopolymerization Initiator [Component (C)]:

8 parts of 2,2-dimethoxy-1,2-diphenylethan-1-one (product name: IRGACURE 651, manufactured by Ciba Geigy Corporation)

4 parts of the dimer of 2-(o-chlorophenyl)-4,5-diphenylimidazole

Polymerizable compound with an Ethylenic Unsaturated Double Bond [Component (B)]:

30 parts of EO (ethylene oxide) modified trimethylolpropane triacrylate (product name: ARONIX M-350, manufactured by Toagosei Co., Ltd.)

10 parts of polyethylene glycol diacrylate (product name: NK ester A-200, manufactured by Shin-Nakamura Chemical Co., Ltd.)

10 parts of N-vinylpyrrolidone (product name: ARONIX M-150, manufactured by Toagosei Co., Ltd.)

Other Additives:

0.1 parts of the polymerization initiator methylhydroquinone

Organic Solvent [Component (D)]:

50 parts of PGMEA 50 parts of MIBK

2) Formation of Resist Layer, Exposure, Developing, and Plating Formation

The formation of the resist layer (application and prebaking), exposure, developing (formation of the resist pattern), formation of the plating, and stripping of the residual resist pattern were conducted under the conditions described below.

Substrate: 5 inch copper substrate

Resist layer thickness: 65 μm

Prebake conditions: 10 minutes at 110° C.

Exposure conditions: CANON PLA501F HARDCONTACT exposure apparatus (product name, manufactured by Canon Corporation), exposure dose 1000 mJ/cm$^2$ Developing conditions: 5 minutes immersion in 0.8% aqueous TMAH solution Plating conditions: copper plating solution, product name CU200 (manufactured by EEJA Ltd.), 90 minutes immersion at 23° C., plating thickness 40 μm Resist pattern stripping: stripping solution STRIP-710 (product name, manufactured by Tokyo Ohka Kogyo Co., Ltd.), 80° C., 20 minutes immersion 3) Evaluations 1

The adhesion of the resist pattern following developing, the resolution of the resist pattern, the degree of developing residue left following developing, the plating characteristics (wetting characteristics), and the removability of the resist pattern were evaluated using the criteria shown below. The results are shown in Table 2.

The adhesion was evaluated using a dot pattern that was formed with varying dot sizes (ranging from 20 to 80 μm in steps of 10 μm).

The resolution was evaluated using a hole pattern that was formed with varying hole sizes (ranging from 20 to 80 μm in steps of 10 μm).

Adhesion o: The adhesion of dot patterns of no more than 30 μm is favorable.

Δ: The criterion for the evaluation O is not satisfied, but the adhesion of dot patterns of no more than 60 μm is favorable.

x: No dot patterns remain following developing.

Resolution o: No residues remain within hole patterns of no more than 30 μm.

Δ: The criterion for the evaluation O is not satisfied, but no residues remain within hole patterns of no more than 60 μm.

x: The inside of holes remain unresolved at all pattern sizes.

Developing Residues o: No resist residues remain on the substrate.

Δ: Minimal resist residues remain on the substrate.

x: Considerable resist residues remain on the substrate.

Plating Characteristics o: Straight copper plating is possible.

Δ: The speed of copper plating is a little slow.

x: The speed of copper plating is slow.

Removability o: Stripping is possible in 20 minutes at 80° C.

Δ: Stripping residues remain following stripping for 20 minutes at 80° C.

x: Stripping impossible.

TABLE 1

| Monomer compositions for the component (A) | | | | | | | | |
|---|---|---|---|---|---|---|---|---|
| Component monomers (parts by weight) | Sample A | Sample B | Sample C | Sample D | Sample E | Sample F | Sample G | Sample H |
| dicyclopentanyl methacrylate | 73 | 35 | 40 | 65 | 73 | 73 | 75 | 71 |
| methacrylic acid | 12 | 10 | 20 | 12 | 12 | 12 | 12 | 12 |
| 2-hydroxyethyl methacrylate | 7 | 25 | 7 | 15 | 7 | 7 | 5 | 9 |
| styrene | | 25 | | | | | | |
| 1,3-butadiene | | 5 | | | | | | |
| n-butyl acrylate | 4 | | | 4 | 4 | 4 | 4 | 4 |
| n-butyl methacrylate | | | 25 | | | | | |
| 2-methoxyethyl acrylate (n = 1) | 4 | | | 4 | 4 | | 4 | 4 |
| methoxydiethylene glycol A (n = 2) | | | | | | 4 | | |
| methoxypolyethylene glycol A (n = 9) | | | | | | | 4 | |
| weight average molecular weight of resin component | 20,000 | 20,000 | 20,000 | 20,000 | 20,000 | 20,000 | 20,000 | 20,000 |

TABLE 2

| Evaluation factor | Sample A | Sample B | Sample C | Sample D | Sample E | Sample F | Sample G | Sample H |
|---|---|---|---|---|---|---|---|---|
| Adhesion | ○ | Δ | Δ | ○ | ○ | ○ | ○ | ○ |
| Resolution | ○ | Δ | x | Δ | ○ | ○ | ○ | ○ |
| Developing residues | ○ | x | Δ | Δ | ○ | ○ | ○ | ○ |
| Plating characteristics (wetting) | ○ | x | Δ | Δ | ○ | ○ | ○ | ○ |
| Removability | ○ | Δ | ○ | ○ | Δ | Δ | ○ | ○ |

As is evident from the results shown in Table 2, the samples A, D, E, F, G, and H according to the present invention display more favorable results than the samples B and C.

4) Evaluations 2

Using the sample A, the solvent used was altered as shown in Table 3, and factors such as the level of edge build-up were evaluated using the criteria shown below.

As described above, the bead length describes the length of the built-up portion at the leading edge of the resist.

Bead Length
A: No more than 5 mm.
B: The criterion for the evaluation A is not satisfied, but no more than 15 mm.

Edge Build-Up
A: No more than 30 μm.
B: The criterion for the evaluation A is not satisfied, but no more than 60 μm.

Drying Characteristics:
A: Drying is possible in no more than 10 minutes at 110° C.
B: The criterion for the evaluation A is not satisfied, but drying is possible in no more than 20 minutes at 110° C.

Foaming:
A: No bubbles.
B: Bubbles can be seen on the resist surface following application.

Ease of Application:
A: For a 100 μm coating, the application uniformity is within ±5%.
B: The criterion for the evaluation A is not satisfied, but the application uniformity for a 100 μm coating is within ±10%.

TABLE 3

| | PGMEA only | PGMEA/MIBK = 50/50 (weight ratio) | PGMEA/MEK = 50/50 (weight ratio) |
|---|---|---|---|
| Bead length | B | A | A |
| Build-up | B | A | A |
| Drying characteristics | B | A | A |
| Foaming | B | A | A |
| Ease of application | B | A | A |

As is evident from the results shown in Table 3, by using MEBK or MEK, the characteristics of the resist composition during application, such as the level of edge build-up, can be improved.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The invention claimed is:

1. A thick film photoresist composition comprising:
   (A) a resin component containing (a) from 61 to 90% by weight of a structural unit derived from dicyclopentanyl (meth)acrylate ester, and (b) a structural unit derived from a radical polymerizable compound containing a hydroxyl group,
   (B) a polymerizable compound containing at least one ethylenic unsaturated double bond,
   (C) a photopolymerization initiator, and
   (D) an organic solvent.

2. A thick film photoresist composition according to claim 1, wherein said resin component contains 65 to 75% by weight of said structural unit (a1).

3. A thick film photoresist composition according to claim 1, wherein said structural unit (b) accounts for at least 1% by weight, but less than 10% by weight, of said component (A).

4. A thick film photoresist composition according to claim 1, wherein said component (A) further comprises (c) a structural unit derived from a radical polymerizable compound represented by a general formula (I) shown below:

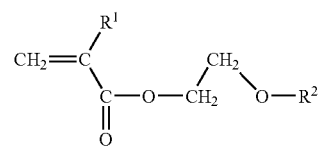

(1)

(wherein, $R^1$ represents a hydrogen atom or a methyl group, and $R^2$ represents a hydrogen atom or an alkyl group of 1 to 4 carbon atoms).

5. A thick film photoresist composition according to claim 1, wherein said component (D) is at least one solvent selected from a group consisting of methyl isobutyl ketone and methyl ethyl ketone.

* * * * *